United States Patent [19]

Campbell et al.

[11] Patent Number: 4,539,933
[45] Date of Patent: Sep. 10, 1985

[54] CHEMICAL VAPOR DEPOSITION APPARATUS

[75] Inventors: Bryant A. Campbell; Dale R. DuBois, both of Los Gatos; Ralph F. Manriquez, Saratoga; Nicholas E. Miller, Cupertino, all of Calif.

[73] Assignee: Anicon, Inc., San Jose, Calif.

[21] Appl. No.: 528,193

[22] Filed: Aug. 31, 1983

[51] Int. Cl.³ .............................................. C23C 13/08
[52] U.S. Cl. ...................................... 118/719; 118/724; 118/725; 118/733; 118/728
[58] Field of Search ............... 118/719, 725, 724, 733, 118/620, 641, 715, 729, 728, 50.1

[56] References Cited

U.S. PATENT DOCUMENTS

| 3,233,578 | 2/1966 | Capita | 118/730 X |
| 3,293,074 | 12/1966 | Nickl | 118/725 X |
| 3,441,000 | 4/1969 | Burd et al. | 118/719 |
| 3,456,616 | 7/1969 | Gleim et al. | 118/733 X |
| 3,675,619 | 7/1972 | Burd | 118/719 |
| 3,704,987 | 12/1972 | Arndt et al. | 118/725 X |
| 3,918,396 | 11/1975 | Dietze et al. | 118/733 X |
| 4,309,240 | 1/1982 | Zaferes | 156/611 |
| 4,348,580 | 9/1982 | Drexel | 118/50.1 |

FOREIGN PATENT DOCUMENTS 843028 6/1981 U.S.S.R. .

Primary Examiner—Norman Morgenstern
Assistant Examiner—Bernard F. Plantz
Attorney, Agent, or Firm—William B. Walker

[57] ABSTRACT

An improved chemical vapor deposition device having heating means substantially surrounding an inner deposition chamber for providing isothermal or precisely controlled gradient temperature conditions therein. The internal components of the chamber are quartz or similar radiant energy transparent material. Also included are special cooling means to protect thermally sensitive seals, structural configurations strengthening areas of glass components subjected to severe stress during operation, and specific designs permitting easy removal and replacement of all glass components exposed to deposition gas.

19 Claims, 6 Drawing Figures

Fig_1

Fig_2

CHEMICAL VAPOR DEPOSITION APPARATUS

FIELD OF THE INVENTION

This invention relates to a chemical vapor deposition apparatus. In particular, this invention relates to an apparatus for the chemical vapor deposition of highly uniform, uncontaminated coatings of selected elements and compounds on substrates, and to components thereof.

BACKGROUND OF THE INVENTION

Chemical Vapor Deposition (CVD) is the process of depositing a solid material from a gaseous phase onto a substrate by means of a chemical reaction. The deposition reaction involved is generally thermal decomposition, chemical oxidation, or chemical reduction. In one example of thermal decomposition, organometallic compounds are transported to the substrate surface as a vapor and are reduced to the elemental metal state on the substrate surface.

For chemical reduction, the reducing agent most usually employed is hydrogen, although metal vapors can also be used. The substrate can also act as a reductant as in the case of tungsten hexafluoride reduction by silicon. The substrate can also supply one element of a compound or alloy deposit. The CVD process can be used to deposit many elements and alloys as well as compounds including oxides, nitrides and carbides.

In the present invention, CVD technology can be used to manufacture deposits on substrates for a variety of purposes. Tungsten carbide and aluminum oxide wear coatings on cutting tools; corrosion resistant coatings of tantalum, boron nitride, silicon carbide and the like and tungsten coatings on steel to reduce erosion can be applied according to this invention. The apparatus and method is particularly advantageous in manufacturing solid state electronic devices and energy conversion devices.

Chemical vapor deposition of electronic materials is described by T. L. Chu et al, *J. Bac. Sci. Technol.* 10, 1 (1973) and B. E. Watts, *Thin Solid Films* 18, 1 (1973). They describe the formation and doping of epitaxial films of such materials as silicon, germanium and GaAs, for example. In the field of energy conversion, the CVD process provides materials for nuclear fission product retention, solar energy collection, and superconduction. A summary of the chemical vapor deposition field is provided by W. A. Bryant, "The Fundamentals of Chemical Vapour Deposition" in *Journal of Materials Science* 12, 1285 (1977), and is hereby incorporated by reference.

The deposition parameters of temperature, pressure, the ratio of reactant gases, and amount and distribution of gas flow critically determine the deposition rates and the ability of a particular system to provide the desired uniformity and quality of deposition. The limitations of prior art systems stem from their inability to adequately control one or more of these factors or from deposit contamination.

DESCRIPTION OF THE PRIOR ART

The reaction chambers employed for chemical vapor deposition are generally classified as cold wall or as hot wall systems. In cold wall systems, the substrate is heated by inductive coupling, radiant heating or direct electrical resistance heating of internal support elements. Hot wall systems rely on radiant heating elements arranged to create a heated reaction and deposition zone. Conduction and convection heating approaches have also been used in hot wall systems.

Cold wall systems for chemical vapor deposition are described in U.S. Pat. Nos. 3,594,227, 3,699,298, 3,704,987, and 4,263,872. In these systems, the semiconductor wafers are positioned inside a vacuum chamber, and induction coils are arranged exterior to the vacuum chamber. The wafers are mounted on a susceptible material adapted for heating by RF energy. By localizing heat to the immediate semiconductor wafer area, chemical vapor deposition is limited to the heated areas. Since the unheated walls are below CVD temperatures, deposition on the walls is reduced. The temperatures in the reaction zone are usually not as uniform as those obtained with hot wall systems.

U.S. Pat. No. 3,705,567 is directed to a system for doping semiconductor wafers with a doping compound. The chamber containing the wafers extends into the oven in a cantilever supported system. Heating elements are provided along the sides, and the temperatures of the centrally located wafers would vary substantially from those at the ends. Diffusion of vapor is perpendicular to the wafer orientation, and the wafers are not exposed to uniform concentrations of doping compound. The edge to center, wafer to wafer, and batch to batch uniformity required for advanced semiconductor devices such as VLSI (very large scale integration) devices can not be achieved with this system. This is a closed, vapor deposition system and does not provide for positive gas flow using a carrier gas.

Hot wall CVD systems currently used in making semiconductor materials are most commonly converted doping ovens. These have long tubular reactors of quartz or similar inert material, and heat is provided by heating elements coiled around the outside of the cylindrical portion. The reactor ends are not heated, and temperature variance is so severe that only a portion in the center of the deposition chamber (typically one-third of the heated total) is useful. Equilibrium temperature variations between parts of the limited reaction zone typically exceeds 4° C. The tube walls become coated, are difficult to remove and clean, and are a source of debris. The wafers are positioned in a boat which is cantilevered from beyond the end of the tubular reactor, the wafers being reloaded by full retraction of the cantilevered support from the chamber. The floor area occupied by a single converted doping oven and associated equipment (for a 30 inch effective reaction zone) is about 70 to 80 sq. feet. These converted ovens have severe limitations for use in manufacturing advanced integrated circuit components, frequently contaminating the semiconductor wafers and causing a high rejection rate. Sustaining power requirements are excessive, and the unit capacity is limited by the lengthy time required to reach thermal equilibrium. Prior to this invention, apparatus has not been available to manufacture the precision, high quality coatings desired by the semiconductor industry for the most advanced integrated circuit components such as VLSI devices. This is a consequence of the increased requirements for the uniform and homogeneous physical and electrical properties such as dielectric strength, resistivity and the like.

SUMMARY AND OBJECTS OF THE INVENTION

The controlled temperature deposition device of this invention comprises an inner deposition chamber having gas distribution means for introducing gas into the inner chamber and removing gas therefrom and a vacuum chamber means surrounding the inner deposition reaction chamber and spaced from the walls thereof for maintaining a minimum vacuum therein. The vacuum chamber means comprises a domed housing and a base cooperating therewith, the material of the domed housing and base being substantially transparent to radiation. Radiant heating means are positioned over the outer surface of the domed housing and base surrounding the inner deposition chamber for providing precisely controlled temperatures in the reaction chamber. The radiant heating means and the outer surface of the domed housing and base are in a non-conducting relationship. The radiant heating means preferably have the same temperature achieved by having the same cross-sectional areas and currents.

The domed housing has a base which engages a support plate. Seals are positioned between the base and support plate to form a vacuum seal. Cooling means engage the outer wall of the domed housing between the base and the portion thereof surrounding the inner deposition chamber for removing heat therefrom, thereby protecting the seals.

The quartz vacuum chamber base has an outer dome portion and an axially concentric inner cylindrical portion integral therewith. The lower terminus of the outer domed portion comprises an outwardly extending annular mounting flange integrally joined to the sidewall thereof by a connecting wall portion having a thickness of at least 0.029 times the inside diameter of the lower terminus.

The inner deposition chamber has a domed portion removably supported on a gas collector. The gas collector has a lower cylindrical portion, the terminus thereof being removably supported on an annular support surface. Preferably, the lower edge of the cylindrical portion and the support therefor having mutually engaging indexing means for orienting the gas collector about its vertical axis. The inner deposition chamber is defined by a domed portion and a plate support means therefor. The support means has a central opening receiving a gas distributor. The flared inlet opening of the gas distributor forms a detachable, sealing engagement with a male gas source member upon which it is supported. The inner components can thus be easily removed for cleaning.

It is an object of this invention to provide a chemical vapor deposition system which provides a more uniform temperature in the inner deposition reaction chamber thereof. It is a further object to reduce the temperature of the vacuum chamber seal engaging surfaces to a level which does not destroy the integrity of the seals. It is a still further object of this invention to provide internal components, components which form the inner deposition reaction chamber and gas distribution means, which are easily removed for cleaning or replacement.

DETAILED DESCRIPTION OF THE INVENTION

The terms "chemical vapor deposition" and "CVD", as used herein, are defined to include modifications of the process which increase or change the reactivity, chemical properties or chemical composition of the reactant gases while retaining the basic characteristics of chemical vapor deposition processes. Thus, processes such as plasma assisted chemical vapor deposition, uv excited (ultraviolet light excited) chemical vapor deposition, microwave excited chemical vapor deposition and the like in which reactant gas molecules are converted to more reactive entities are included within the meaning of these terms as used herein.

The term "radiant heat source(s)", as used herein, includes any device, system or means for heating whereby at least a part of the heat is transferred by radiation. It is recognized and intended that heat transfer by conduction and convection will also occur. The "radiant heat source" can be any material having an elevated temperature, without limitations as to how the temperature elevation was affected. Resistance heating elements and coatings, heat lamps, heated liquids and solutions, and microwave or induction heated materials can function as "radiant heat sources", for example.

Figure 1:
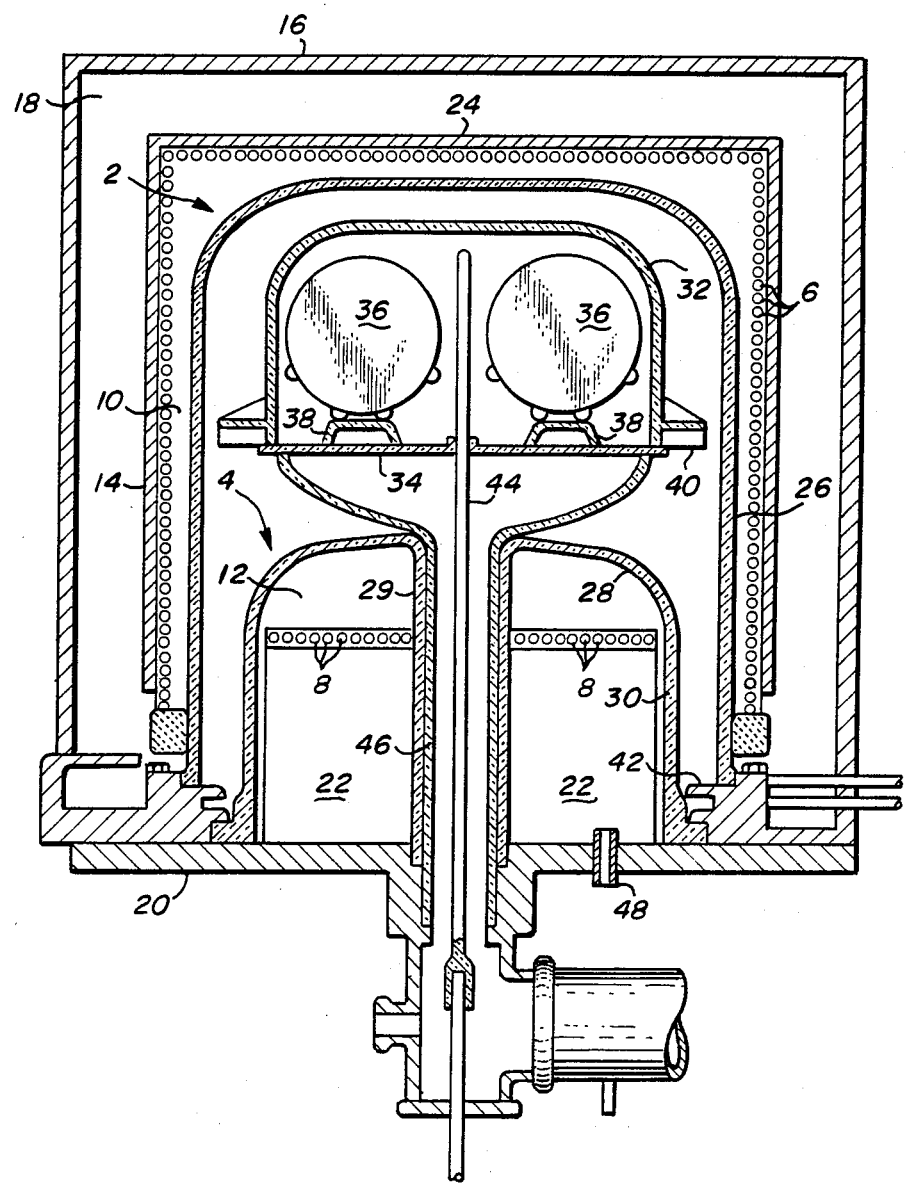
FIG. 1 is a cross-sectional view of the CVD device of this invention.

Referring to FIG. 1, a cross-sectional view of the chemical vapor deposition device of this invention is shown. The environment for the chemical vapor deposition is controlled within a zone defined by the domed housing 2 and domed base 4. These are constructed from a composition which is substantially transparent to radient heat. Resistance heating elements 6 and 8 are illustrated. The radiant heat passing through the walls of the domed housing 2 and domed base 4 heats the chemical vapor deposition zone defined by these components. The resistance heating elements 6 and 8 are separated from the respective domed housing wall 2 and dome base 4 by an air space 10 and 12, respectively. By avoiding conductive heat transfer from the heating elements 6 and 8 to the walls of the domed housing 2 and domed base 4, the heat load thereon is reduced and as is described in greater detail hereinafter, thermal damage to heat sensitive sealing components is prevented.

The resistance heating elements 6 are supported on the inner housing wall 14 which is separated from the outer housing shell 16 by insulation 18. The resistance heating element 8 is separated from the support base 20 by insulation 22.

The term "dome" as used herein with respect to the housing 2 and base 4 can have a variety of configurations. For example, the top 24 of the domed housing 2 can be hemispherical. Preferably, the top has a flattened configuration, that is, has a spherical radius which is greater than the radius of the cylindrical sidewall 26. In a similar manner, the top 28 of the dome base 4 can have a flattened configuration, the radius of curvature thereof in a vertical plane through the central axis being greater than the radius of the base of the sidewall 30. The upper end of the axially concentric inner cylinder 29 of the domed base 4 flares outwardly to become the upper portion 28 integral therewith. The inner deposition reaction chamber is defined by the upper reaction chamber wall 32 and support plate 34. The plate 34 which supports wafers 36 held in a vertical plane by the boats 38 can also be a plurality of rods. The domed reaction chamber wall 32 has outwardly extending projections 40 which are engaged by projections 42 when the outer housing components are lifted to expose the inner deposition chamber. The gas supply conduit 44 extends from the inner deposition reaction chamber defined by the domed reaction chamber housing 32 through the support plate 34 and down the center of the gas collector 46. Conduit 48 passing through the support base 20 can be used to reduce gas pressure in the interior of the domed base 4.

The temperature uniformity in the inner deposition reaction chamber achieved with the apparatus of this invention is substantially better than is obtainable with prior art CVD devices. This provides a far more uniform coating on wafers, for example.

A major improvement has been achieved wherein the radiant heating means are all at a temperature which, at steady state, is the same as the temperature desired in the inner deposition reaction chamber. In a preferred embodiment of this invention, this uniform radiant heater temperature is obtained by using resistance heating elements 6 having the same cross-sectional area and by passing the same current through each of the heating elements. Suitable power supplies are commercially available as stock items and employ conventional technology which is well known in the art. If the heating elements 6 are formed from a continuous wire or are in a series configuration, this effect can be automatically achieved with a simple power source. If several resistance element circuits are used and each is made of wire having the same cross-sectional area and same length, the constant current can be obtained with a single power supply by placing the resistance heating elements in parallel.

Figure 2:
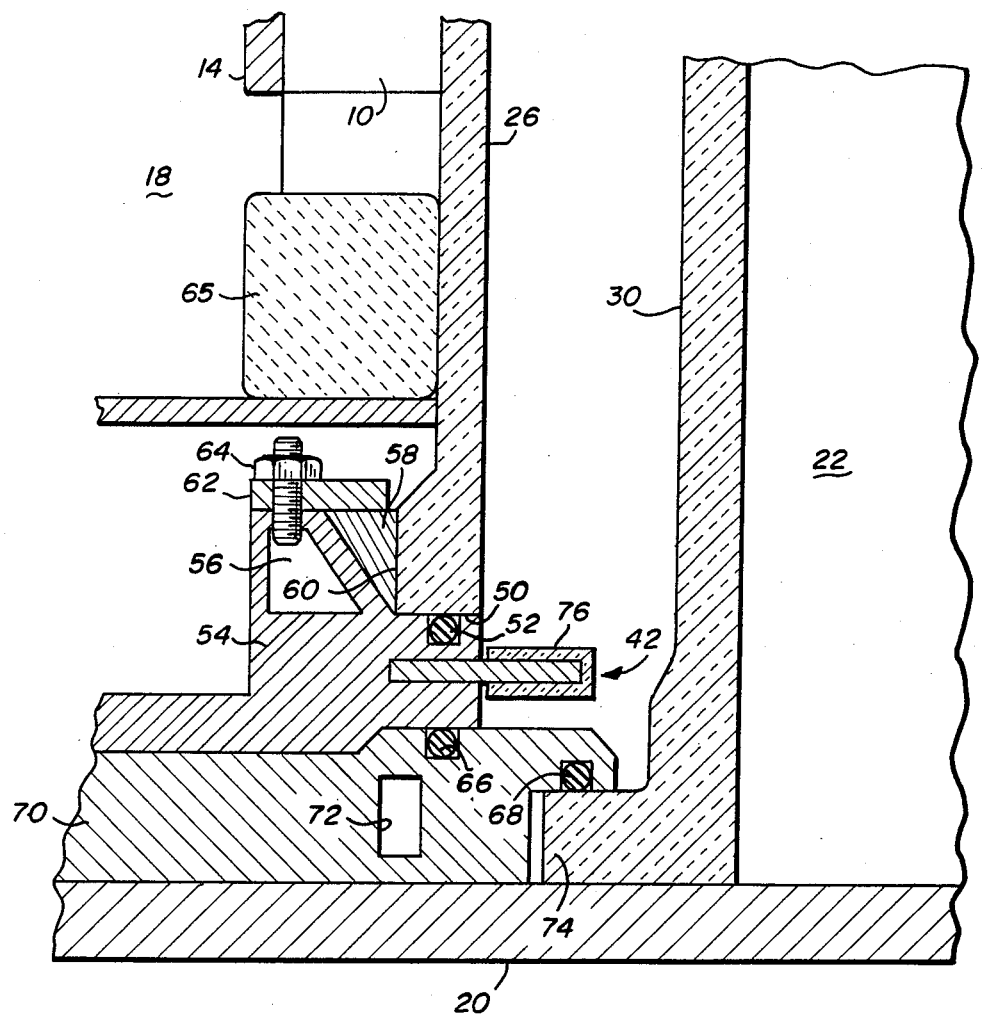
FIG. 2 is a partial, cross-sectional view of the detailed flange construction of the CVD device shown in FIG. 1, left portion.
Figure 3:
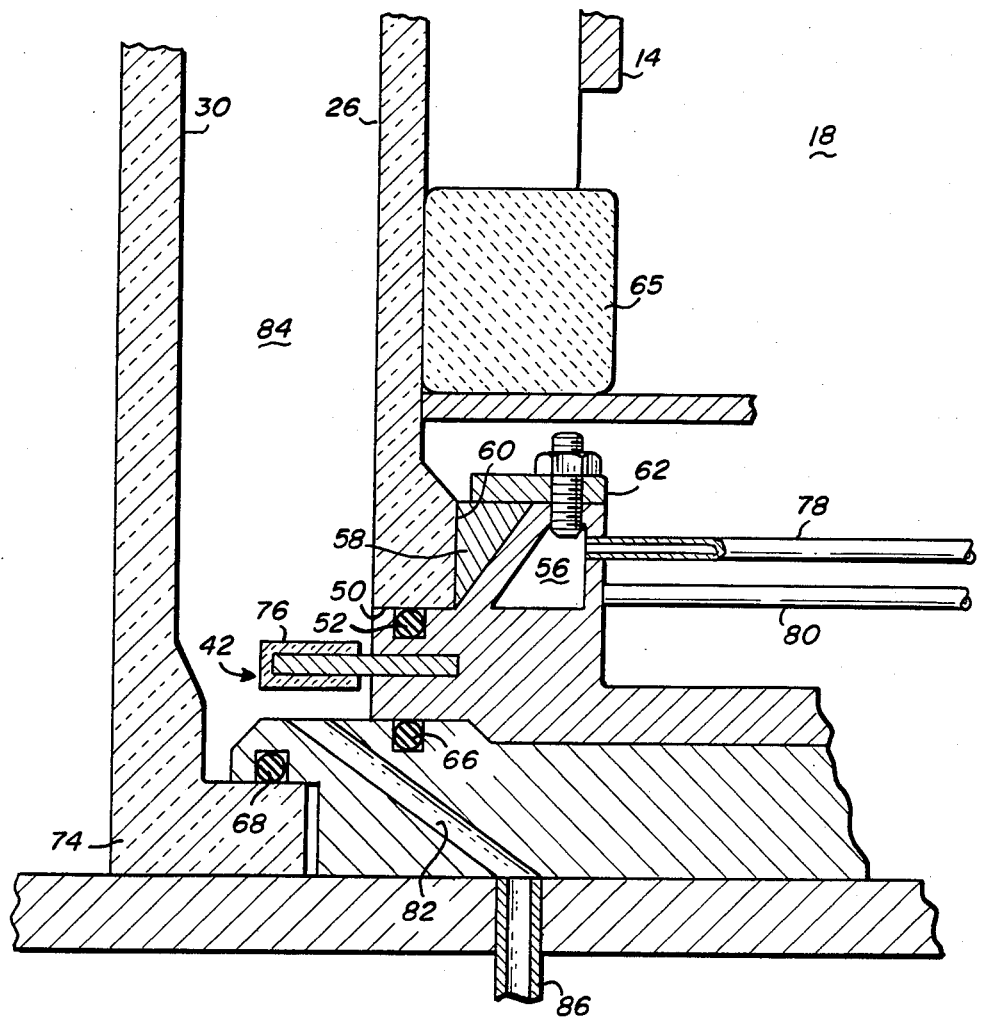
FIG. 3 is a partial, cross-sectional view of the detailed flange construction of the CVD device shown in FIG. 1, right portion.

FIGS. 2 and 3 are partial, enlarged cross-sectional views of the flanged area of the device shown in FIG. 1. FIG. 2 shows the left portion and FIG. 3 shows the right portion. The bottom edge 50 of the domed housing 2 engages the seal 52 supported by the annular plate 54 to establish a vacuum seal. The seal 52, being of organic polymeric elastomeric material such as a high temperature synthetic rubber O-ring is quickly destroyed if exposed to the elevated temperatures which are present in the chemical vapor deposition reaction chamber during normal use of the apparatus. The annular seal plate 54 constitutes a heat sink which is cooled by a cooling liquid circulating in the channel 56. A conductive ring of metal or similar material 58 having a wedge-shaped cross-section is held in a thermoconductive relationship with the outer wall surface 60 of the domed housing 2 and a sloped surface of the plate 54. The ring 58 can be preformed of highly conductive metal such as copper or can be formed in place by packing a metal wool such as copper wool in the wedge-shaped cavity. The conductive ring 58 is pressed against the heat transfer surfaces by the pressure of annular plate 62 and nut 64. The end of the air gap or air space 10 is closed by the insulating ceramic seal 65. With this configuration, the portions of the domed housing wall 2 directly exposed to the highest temperatures, those directly surrounding the inner deposition reaction chamber, are thermally isolated from the destructible seal 52. The lower portions of the domed housing wall 26 are not directly exposed to elevated temperatures. Heated gas in the air space 10 is blocked by the sealing ceramic ring 65. Heat conducted down the wall of the domed housing 2 is removed by the conductive ring 58, further reducing the temperature to which the seal 52 is exposed. Similar vacuum seals 66 and 68 are protected by physical separation from the hottest components and further are cooled by the annular plate 70 which has a coolant channel 72 through which a cooling liquid is passed.

The sidewall 30 of the domed base 4 terminates in the outward extending flange 74 by which it is held by plate 70 against support plate 20. The lower portion of the domed base 4 is insulated from the zone of highest temperature by insulation 22. The projection 42 which engages and raises the domed reaction chamber housing 32 by engaging projection 40 extending therefrom (see FIG. 1) extends from the annular plate 54. The exposed surface thereof is covered with quartz or other suitable sleeve 76 which prevents contamination of the deposition zone by the metal during opening and closing of the apparatus.

Referring to FIG. 3, the cooling channel 56 is supplied with cooling water through cooling water conduit 78, conduit 80 removing the cooling water from the channel.

Passageway 82 communicates with gas space 84 between the dome housing 2 and dome base 4. Gas supplied through the passageway 82 from the non-reactive gas supply connector 86 provides the positive pressure between these two walls, thereby preventing escape of reaction gases from the reaction chamber. The non-reactive or inert gas can be nitrogen, hydrogen, etc. depending upon the CVD reaction being carried out.

Figure 4:
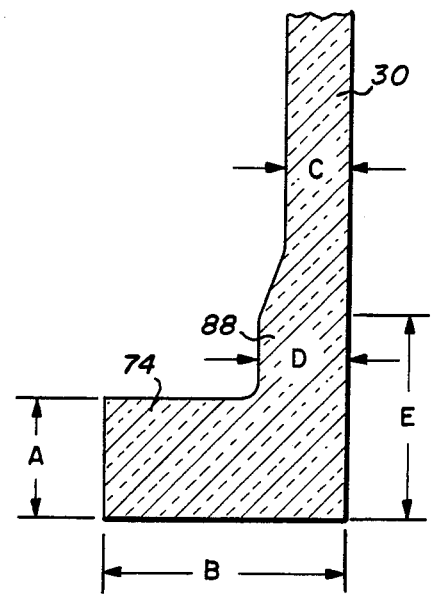
FIG. 4 is a cross-sectional, detailed view of the construction of the mounting flange of the inner vacuum chamber base.

The dome base 4 preferably has a specially constructed mounting flange 74. This component is subjected to high stress when the inner chamber is evacuated, and we have discovered that the most severe stresses are concentrated adjacent the flange 74. Therefore, the lower wall portion 88 of the sidewall 30, the zone marked E in FIG. 4, must have a minimum thickness in order to provide the requisite strength. The thickness D should be at least 0.029 times the inside diameter of the flange 74 which constitutes the terminus of the sidewall 30. In a reaction chamber wherein the domed base has a flange with an inner diameter in the horizontal plane of 16 in., for example, the dimensions of the other portions of the flange and lower sidewall can be as follows: A=0.75 in., B=1.5 in., C=0.375 in., D=0.56 in and E=2.125 in.

Figure 5:
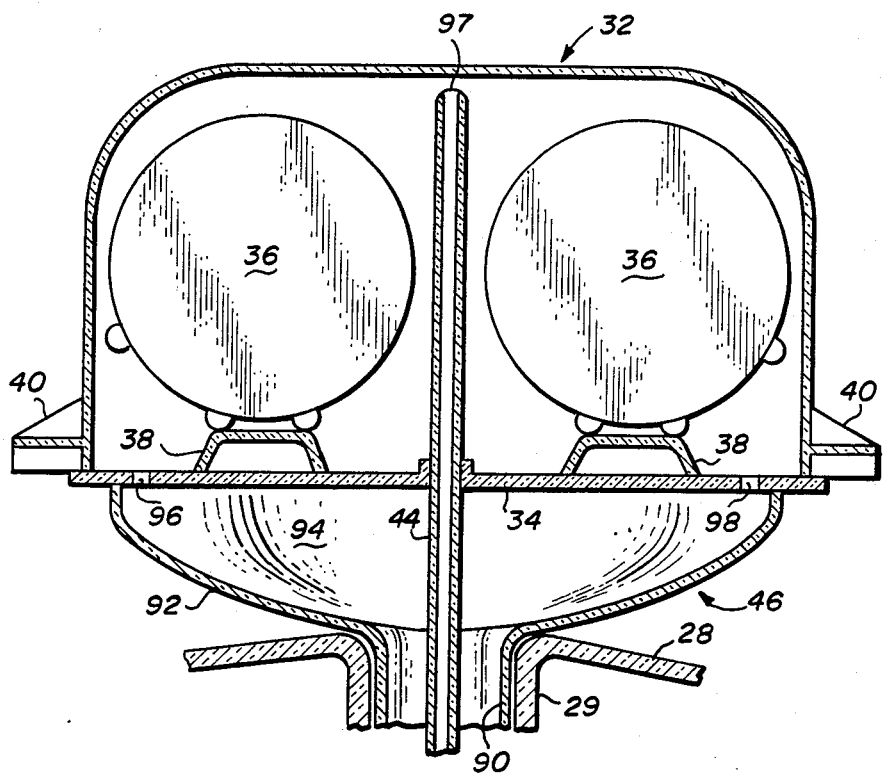
FIG. 5 is a cross-sectional view of the inner deposition reaction chamber and gas collector construction.

FIG. 5 is a cross-sectional view of the inner deposition reaction chamber and associated components. The domed reaction chamber upper wall portion 32 rests on the support plate 34. The projections 40 extend beyond the edge of support plate 34 for lifting engagement with the projections 42 (see FIG. 1). The reaction zone is therefor defined by the upper wall portion 32 and the support plate 34. The wafer boats 38 rest on the support plate 34, and the wafers 36 are supported in a vertical orientation thereon.

The gas collector 46 has a cylindrical lower portion 90 and an upper section 92 which flares outwardly to form a bowl section integral therewith. The upper portion 92 in conjunction with the plate 34 forms a gas collection chamber 94 which communicates with the reaction zone through the gas collecting ports 96 and 98. The ports 96 and 98 are preferably located adjacent the outer edge the plate 34 but within the area defined by the flared upper portion 92. The plate 34 and flared gas collector portion 92 can be separate or integral. The gas supply 44 extends through the center of the plate 34 and terminates in the gas outlet 99. The gas collector cylinder 90 is enclosed within the inner cylinder portion 29 of the sidewall 28. Gas emerging from the gas outlet 97 passes between the vertically oriented wafers 36 in a single pass and immediately through collecting ports 96 and 98. Gas composition gradients resulting from depletion of reactive components is thereby minimized.

Figure 6:
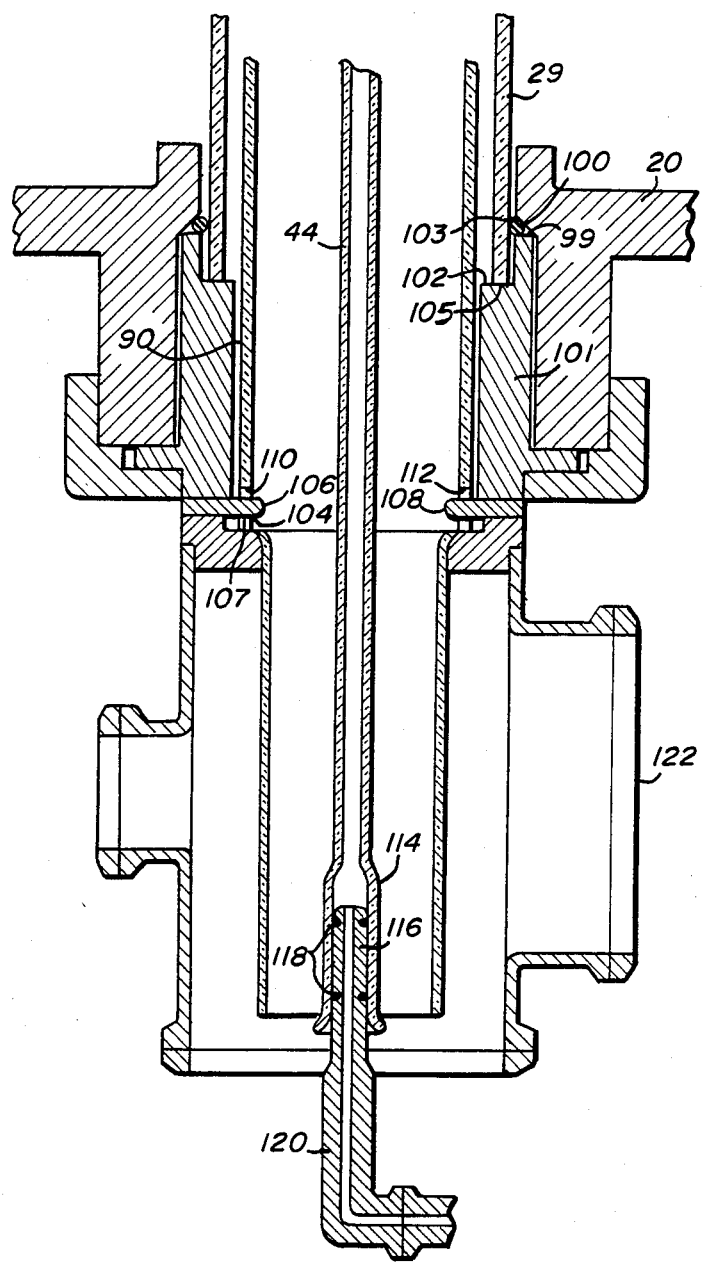
FIG. 6 is a cross-sectional view of the lower support structure for the inner deposition reaction chamber and gas distributor.

FIG. 6 is a detailed cross-sectional view of the lower portion of the gas collector system.

The inner cylinder 29 of the domed base 4 is sealed against the upper edge 99 of the cylindrical vacuum sleeve plate 101 by the seal 100. The sloped annular surface 103 of the plate 20 provides sealing pressure against seal 100. The bottom edge 105 of the inner cylinder 29 rests on the supporting annular shelf 102.

The cylindrical lower portion 90 of the gas collector 46 is enclosed within the cylindrical portion 29 of the domed base 4, and the lower terminus 107 thereof rests on the annular supporting shelf 104. The projections 106 and 108 engage corresponding respective notches 110 and 112 in the terminus, thereby precisely orienting the gas collector about its vertical axis. The gas supply conduit 44 extends down the center of the cylindrical portion 90, and the lower end 114 thereof has an enlarged and flared configuration. The gas supply system has a male gas supply outlet 116 which engages and supports the flared portion 114. The seals (O-rings) 118 form a sealing engagement with the inner surface of glass supply conduit flared portion 114. Gases supplied to the male member 116 through the gas supply linkage connector 120. Gas exhausted from the reaction chamber zone through ports 96 and 98 and through the gas collector 46 passes down the cylindrical section 90 and is exhausted through the outlet exhaust port 122 communicating therewith.

The internal components of the gas delivery and collection system as well as the components defining the reaction chamber are preferably made of quartz glass or similar material which is transparent to radiant heat and which can be easily cleaned to remove all traces of metal or other chemicals deposited thereon during operation of the equipment. One or more of the internal components can be removed for cleaning when the equipment is opened during the loading cycle. These elements can be quickly removed and replaced. The domed housing 32 rests on the support plate 34 and lifted from it for replacement of wafers. Gas supply tubing 44 is lifted vertically to disengage it from the gas supply fitting 116. Replacement tubing is inserted from above, the flanged terminal end thereof facilitating re-engagement with the male portion 116. The gas collector 90, supported on the shelf 104 can be removed by lifting it vertically, and a replacment gas collector can be inserted by lowering it and rotating it until the projections 106 and 108 engage the notches 110 and 112 and the terminus rests on the shelf 104.

The invention claimed is:

1. A controlled temperature deposition device comprising an inner deposition reaction chamber having gas distribution means for introducing gas into the inner chamber and removing gas therefrom, vacuum chamber means surrounding the inner deposition reaction chamber and spaced from the walls thereof for maintaining a medium vacuum therein, the vacuum chamber means comprising a domed housing and a base cooperating therewith, the material of the domed housing and base being substantially transparent to rdiation, said radiant heating means being positioned over outer surfaces of the domed housing and base surrounding the inner deposition chamber for providing precisely controlled temperatures in the reaction chamber, the radiant heating means and the outer surface of the domed housing and base being in a non-conducting relationship, wherein the domed housing has a domed housing base which engages a support plate, sealing means are positioned between the domed housing base and the support plate to form a vacuum seal, and cooling means engage the outer wall of the domed housing between the domed housing base and the portion thereof surrounding the inner deposition reaction chamber for removing heat therefrom.

2. The controlled temperature deposition device of claim 1 wherein the radiant heating means comprise resistance heating elements spaced apart from the outer surfaces of the domed housing and base.

3. The controlled temperature deposition device of claim 1 wherein the radiant heating means comprise resistance heating element means for providing a uniform heating element temperature.

4. The controlled temperature deposition device of claim 3 wherein the resistance heating element means comprise a plurality of resistance heating elements each having substantially the same cross-sectional area and length.

5. The controlled temperature deposition device of claim 1 wherein the cooling means is a metal conducting element in thermally conducting engagement with the outer wall of the domes housing and a water cooled rim.

6. The controlled temperature deposition device of claim 5 wherein the metal conducting element has a wedge-shaped cross-section.

7. The controlled temperature deposition device of claim 1 wherein the sealing means is an organic polymer seal.

8. A quartz vacuum chamber base for a controlled temperature deposition chamber having an outer domed portion and an axially concentric inner cylinder portion integral therewith, the lower terminus of the outer dome portion comprising an outwardly extending annular mounting flange integrally joined to the sidewall thereof by a connecting wall portion having a thickness of at least 0.029 times the inside diameter of the lower terminus.

9. The quartz vacuum chamber base of claim 8 wherein the outer dome portion has a flattened top surface.

10. The quartz vacuum chamber base of claim 9 wherein the cross-sectional radius of curvature of the top of the outer domed portion taken through the vertical axis thereof is greater than the maximum radius of the sidewall portion in the horizontal plane.

11. The quartz vacuum chamber base of claim 8 wherein the upper portion of the inner cylinder flares outwardly to integrally join the top of the outer domed portion.

12. A controlled temperature deposition device comprising radiant heating means substantially surrounding an inner deposition reaction chamber for providing precisely controlled temperature conditions therein, the inner deposition reaction chamber having gas distribution means for introducing gas into the inner chamber and removing gas therefrom, and vacuum chamber means surrounding the inner deposition reaction chamber and spaced from the walls thereof for maintaining a medium vacuum therein, the vacuum chamber means comprising a domed housing and a base cooperating therewith, the material of the domed housing and base being substantially transparent to radiation, said radiant heating means being positioned over the outer surface of the domed housing and base for providing precisely controlled temperatures in the reaction chamber, the inner deposition chamber having a domed upper portion removably supported on a gas collector means, the gas collector means having a lower cylindrical portion removably supported on an annular support surface.

13. The controlled temperature deposition device of claim 12 wherein the lower edge of the cylindrical portion and the support having mutually engaging means for precisely orienting the gas collector about its vertical axis.

14. The controlled temperature deposition device of claim 12 wherein the gas collector includes an upper plate means for supporting wafers, the plate means having gas passageway means for collecting gas from the deposition chamber.

15. The controlled temperature deposition device of claim 14 wherein the cylindrical portion of the gas collector has a flared upper portion integral therewith, the upper edge thereof engaging the upper plate means, and the gas passageway means communicating with the interior of the flared upper portion of the gas collector.

16. The controlled temperature device of claim 15 wherein the upper edge of the cylindrical portion of the gas collector is integrally joined to the upper plate means.

17. The controlled temperature deposition device of claim 15 wherein the gas passageway means is positioned adjacent the edge of the gas collector.

18. A controlled temperature deposition device comprising radiant heating means substantially surrounding an inner deposition reaction chamber for providing precisely controlled temperature conditions therein, the inner deposition reaction chamber having gas distribution means for introducing gas into the inner chamber and removing gas therefrom, and vacuum chamber means surrounding the inner deposition reaction chamber and spaced from the walls thereof for maintaining a medium vacuum therein, the inner deposition chamber being defined by a domed portion and a plate support means therefor, the support means having a central opening receiving a gas distributor, the flared inlet opening of the gas distributor forming a detachable, sealed engagement with a gas supply outlet means.

19. A controlled temperature deposition device comprising an inner deposition reaction chamber defined by containing walls, and having associated therewith gas distribution means for introducing gas into the inner deposition reaction chamber and for removing gas therefrom, vacuum chamber means surrounding the inner deposition reaction chamber and spaced from the walls thereof for maintaining a medium vacuum therein, the vacuum chamber means comprising a domed housing and a base cooperating therewith, the material of the domed housing and base being substantially transparent to radiation, said radiant heating means being positioned over outer surfaces of the domed housing and base surrounding the inner deposition chamber for providing precisely controlled temperatures in the reaction chamber, the radiant heating means and the outer surface of the domed housing and base being in a non-conducting relationship, wherein the resistance heating element means comprise a plurality of resistance heating elements, each resistance heating element having substantially the same cross-sectional area and length.

* * * * *